United States Patent [19]

Fattaruso

[11] Patent Number: 5,508,639
[45] Date of Patent: Apr. 16, 1996

[54] CMOS CLOCK DRIVERS WITH INDUCTIVE COUPLING

[75] Inventor: John W. Fattaruso, Dallas, Tex.

[73] Assignee: Texas Instruments Incorporated, Dallas, Tex.

[21] Appl. No.: 373,694

[22] Filed: Jan. 13, 1995

[51] Int. Cl.⁶ ............................................. H03K 19/096
[52] U.S. Cl. ................................. 326/97; 326/98; 326/83
[58] Field of Search ................................. 326/93, 95, 96, 326/97, 98, 82, 83, 86, 87; 327/141, 144, 145, 168

[56] References Cited

PUBLICATIONS

Seitz et al.; "Hot Clock nMOS"; paper delivered at the 1985 Chapel Hill Conference on VLSI; pp. 1–17, Computer Science Press, 1985.
Koller et al.; "Adiabatic Switching, Low Energy Computing, and the Physics of Storing and Erasing Information"; Aug. 1992; pp. 1 . 5.
Merkle; "Reversible Electronic Logic Using Switches"; ©1990 by Xerox Corporation; published Sep. 1992, pp. 1–31.
Younis et al.; "Practical Implementation of Charge Recovering Asymptotically Zero Power CMOS"; Oct. 1992; pp. 1–15.

Primary Examiner—Edward P. Westin
Assistant Examiner—Benjamin D. Driscoll
Attorney, Agent, or Firm—John D. Crane; James C. Kesterson; Richard L. Donaldson

[57] ABSTRACT

The invention is a power conserving clock driver circuit operative where a differential pair of clock (clock+ and clock−) signals are desired. The circuit responds to transitions in both clock signals to turn off the clock driver transistors (M1P,M1N) (M2N, M2P) for a period of time. During that period of time, a pass gate configuration (M3N, M3P) is conductive. When this occurs, the charge on one of the capacitive loads $C_{L1}$ or $C_{L2}$ is transferred through the inductor $L_c$. In this fashion, part of the charge on one of the capacitive loads is transferred directly to the other capacitive load thereby conserving power. The time period during which this power transfer occurs is the time for one half cycle at the natural resonant frequency of the circuit comprised of $L_c$, $C_{L1}$ and $C_{L2}$.

8 Claims, 3 Drawing Sheets

CMOS CLOCK DRIVERS WITH INDUCTIVE COUPLING

FIELD OF THE INVENTION

This invention relates broadly to the field of digital electronics and particularly to a clock driver circuit which has reduced power requirements as compared to prior art clock driver circuits.

BACKGROUND OF THE INVENTION

In known VLSI electronic components, a significant factor in defining the power consumed by the chip is the power consumed by a clock driver circuit. Typically, such clock driver circuits are differential circuits in that they produce two different clock signals, with one such clock signal being the inverse of the other. Each of these drivers are connected by interconnections with a large number of circuits connected thereto. As such, a good deal of current is required to drive all the circuits receiving the differential clock signals. This is due to the capacitive nature of the load placed on the driver circuit by circuit capacitance as well as the interconnect wiring capacitance. Accordingly, the clock driver circuit must be capable of delivering a great deal of current to charge the capacitance associated with the load coupled thereto.

Various approaches have been tried to overcome problems associated with capacitive loading on clock driver circuits which increases the transition time for the clock signal to switch from one state to the opposite state (i.e., from high to low or from low to high). One approach has been to increase the number of clock driver circuits coupled in parallel to thereby reduce the loading on each clock driver. This approach, however, requires a large number of additional clock driver circuits to have any significant effect on the capacitive loading of each clock driver. When this is done, there is a corresponding increase in the chip area needed to provide clock signals which thereby reduces the number of active logic circuits and the like which can be designed into the circuit. Also, there is increased danger of clock skewing between the various clock circuits. In addition, it does not function in a way which will reduce the power requirements for the clock driver circuit.

A second approach to improving the switching speed for clock driver circuits has been to utilize a bipolar ECL circuit to act as the clock driver circuit. Due to the current handling capacity of a bipolar transistor, such circuits produce faster switching of clock states from one state to another than can be provided by a CMOS clock driver of conventional design. This approach, however, does require creating the bipolar circuit in an otherwise MOS design which does contribute to greater manufacturing complexity and may give rise to other problems associated with BiCMOS designs. It also does not function in a way to reduce the power requirements for the clock driver circuit.

BRIEF DESCRIPTION OF THE INVENTION

It is, therefore, an object of the present invention to provide a CMOS circuit which will reduce the power requirements for clock driver circuits.

It is a further objective of the present invention to provide a CMOS circuit which will speed the transition of clock signals from one state to another.

It is still a further objective of the present invention to provide a CMOS circuit which speeds the transition of clock signals while reducing the power requirements for the clock driver by a factor of in the range of 3 to 4.

In achieving these and other objectives, advantages and features of the present invention, a circuit is provided for use with differential clocking circuits which are characterized by having two clock signals 180° out of phase with each other. At the time when the two clock signals change state, a switching circuit couples most of the charge from the clock that has charge on its capacitive load to the clock that needs to supply charge to its capacitive load. The switching circuit includes an inductor for coupling the charge from one capacitive load to the other.

BRIEF DESCRIPTION OF THE DRAWINGS

The above mentioned and other objects, advantages and features of the present invention are described below in greater detain in connection with the drawings wherein.

DETAILED DESCRIPTION

Figure 1:
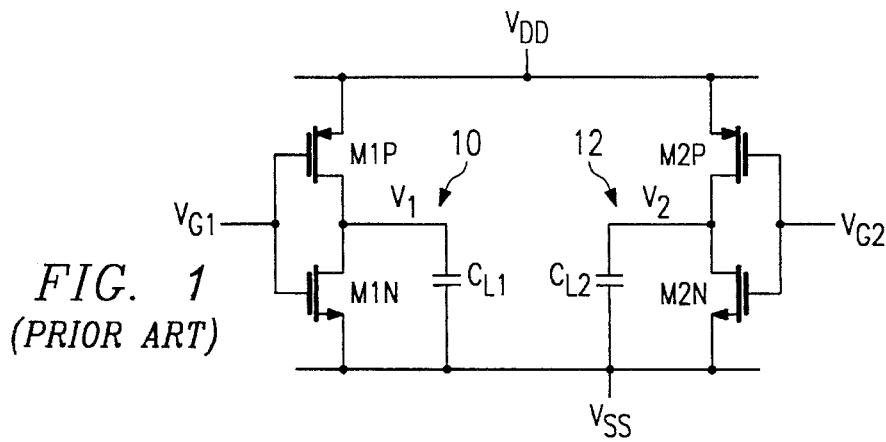
FIG. 1 schematically illustrates a differential clocking arrangement of the prior art which has a capacitive load.
Figure 2:
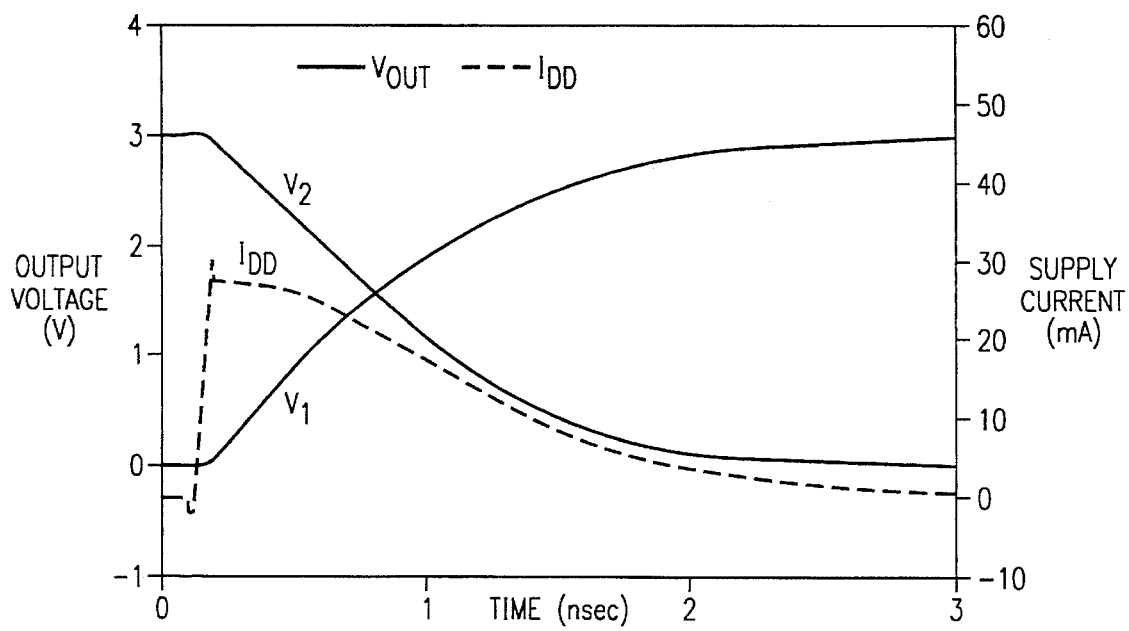
FIG. 2 illustrates the operation of the circuit of FIG. 1 for the specific components used in that configuration.

A differential clock driver network is illustrated in FIG. 1. This circuit has a first phase clock signal $V_{G1}$ input to the first clock driver 10 which includes two series connected transistors M1P and M1N disposed between the positive supply $V_{DD}$ and the other supply $V_{SS}$. This circuit has a second phase clock signal $V_{G2}$ input to the second clock driver 12 which includes two series connected transistors M2P and M2N disposed between the positive supply $V_{DD}$ and the other supply $V_{SS}$. When the clock signal $V_{G1}$ is high, the clock signal $V_{G2}$ is low and transistors M1N and M2P are conducting. This causes the voltage at $V_1$ to go low and the voltage at $V_2$ to go high. When the clock signal $V_{G1}$ subsequently goes low and $V_{G2}$ goes high, transistors M1N and M2P turn off and M1P and M2N turn on. This causes the voltage at $V_1$ to go high and the voltage at $V_2$ to go low The timing diagram of FIG. 2 is for the circuit of FIG. 1 with specific circuit elements listed therein. Specifically, the load capacitors $C_{L1}$ and $C_{L2}$ are both equal to 10 pF. The N transistors of FIG. 1 have a gate width $W_N$ equal to 60 µm and the P transistors have a gate width $W_P$, equal to 180 μm. The P and N transistors both have a gate length of 0.6 μm. The voltage at $V_1$ and $V_2$ are shown as well with the voltage at $V_1$ rising and the voltage at $V_2$ falling. These voltages do not change instantly due to the fact that the capacitive loads $C_{L1}$ and $C_{L2}$ have to respectively charge and discharge. The current $I_{DD}$ is the current supplied by the supply $V_{DD}$ and the integral of the current from time 0 to 3 nsec is equal to about $Q_{DD}$=31 pC of charge required from the power supply during the time that $C_{L1}$ charges and $C_{L2}$ discharges.

Figure 3:
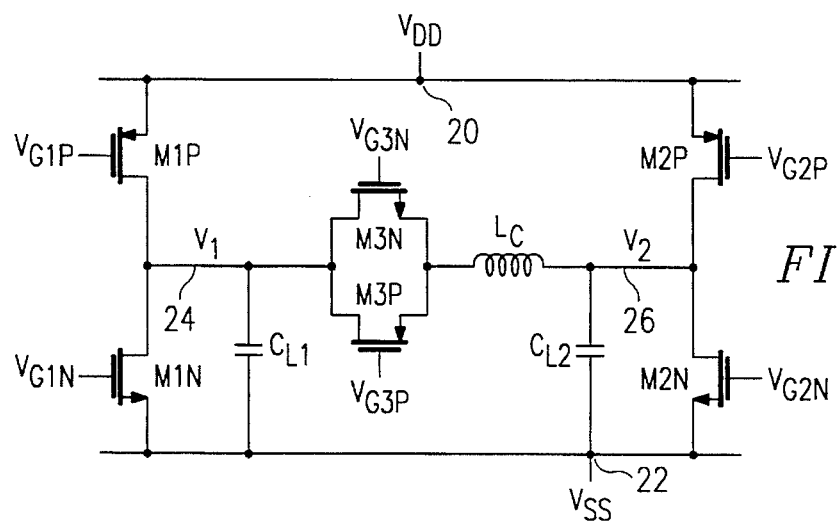
FIG. 3 illustrates the clock driver circuit for providing differential clock signals which, according to the present invention, reduces the power requirements for the clock driver power supply due to charge transfer from one capacitive load to the other.

One implementation of the preferred embodiment of the present invention is illustrated in FIG. 3. A first terminal 20 couples to a first power source $V_{DD}$. A second terminal 22 couples to a second power source $V_{SS}$. A first and second P type transistor M1P and M2P couple their sources to the first terminal 20. A first and second N-type transistor couple their sources to the second terminal 22. The drain of the first P-type transistor M1P and the drain of the first N-type transistor M1N couple to a first output terminal 24. The drain of the second P-type transistor M2P and the drain of the second N-type transistor M2N are coupled to a second output terminal 26.

Coupled between the first and second output terminals is a pair of transistors M3P and M3N configured in a pass gate configuration which are coupled in series with an inductor $L_C$. In addition, the first output terminal is coupled to a capacitive load $C_{L1}$ which represents primarily the capacitance of all the circuits coupled thereto. The second output terminal is coupled to a capacitive load $C_{L2}$ which represents primarily the capacitance of all the circuits coupled thereto.

In operation, the circuit of FIG. 3 functions as follows. Assume at the starting time, the first N-type transistor M1N and the second P-type transistor M2P are conducting. When the external clock coupled thereto changes state, the objective of the circuit is first to turn off all the transistors M1N, M1P, M2N and M2P. Then, the transistors M3N and M3P are turned on so that the charge on the capacitor $C_{L2}$ can be transferred through the inductor $L_C$ to the capacitor $C_{L1}$. The period of time that this conductive path between $C_{L2}$ and $C_{L1}$ is selected to be sufficiently long to assure that more than half the charge on $C_{L2}$ is transferred to $C_{L1}$. It has been determined that one method for calculating a useful time period for establishing this connection between $C_{L2}$ and $C_{L1}$ is to determine the length of one half cycle for the natural resonant frequency for the network comprising $L_C$, $C_{L2}$ and $C_{L1}$. Other time periods may be selected as well, however, circuit performance may suffer the further the delay is away from that determined by the above stated method.

Figure 4:
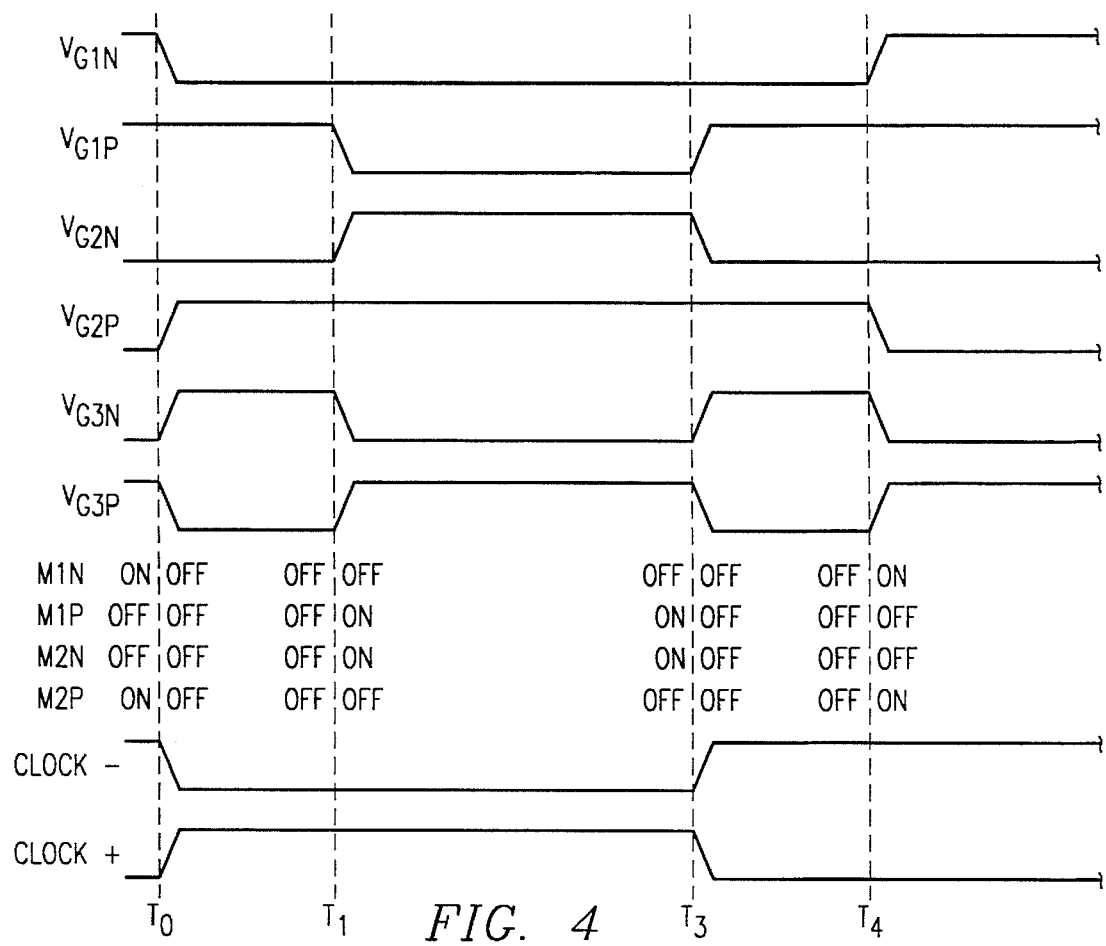
FIG. 4 is a timing diagram for the signals illustrated in FIG. 3.
Figure 5:
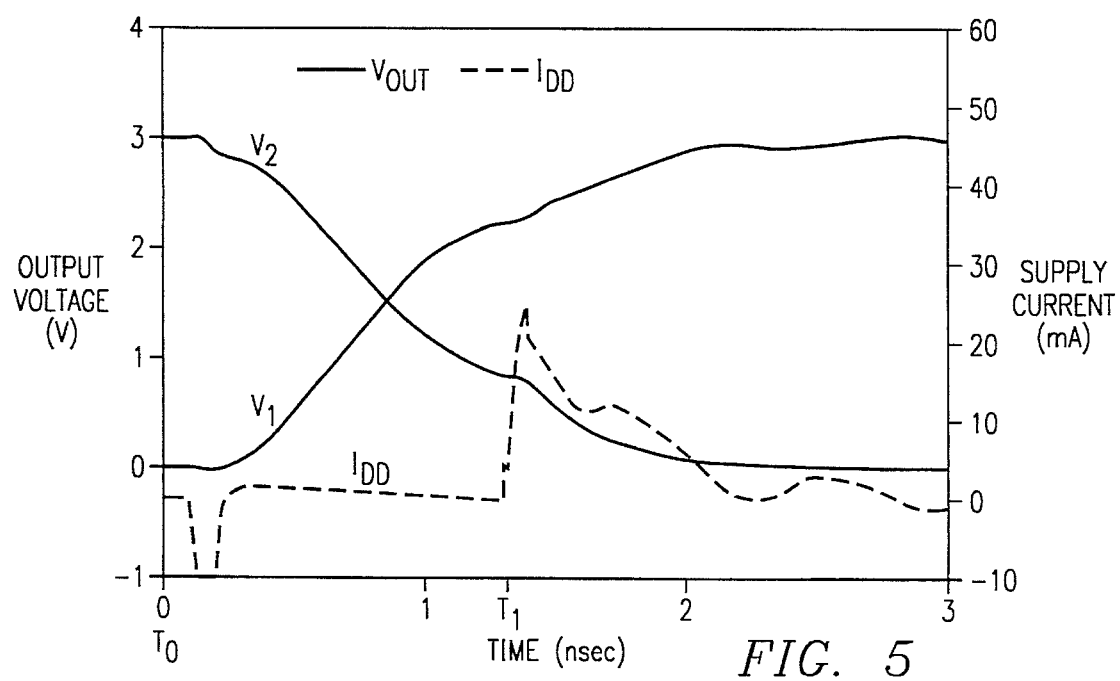
FIG. 5 is an illustration similar to that of FIG. 2 but for the specific components listed therein arranged in a configuration of FIG. 3.

In detail, the circuit of FIG. 3 functions as follows which is illustrated by the timing diagram of FIG. 4. Prior to time $T_O$, transistors M1N and M2P are conducting and the voltages V1 and V2 respectively are low and high. When the clock transitions at time $T_O$, the voltage at the gate of transistor M1N falls as illustrated at $V_{G1N}$. This causes transistor M1N to stop conducting. At the same time $T_O$, the voltage at the gate to transistor M2P rises as illustrated at $V_{G2P}$. This causes transistor M2P to stop conducting. At the same time $T_O$, transistors M3N and M3P are turned on by respectively by the signals $V_{G3N}$ and $V_{G3P}$ as illustrated in FIG. 4. When this occurs, the charge on capacitor $C_{L2}$ begins to be transferred to capacitor $C_{L1}$. This means the voltage at V2 begins to fall and the voltage at V1 begins to rise. This is illustrated in FIG. 5 and continues until time $T_1$. By the time $T_1$ the voltage at V2 has fallen to about 0.8 volts from a starting point of 3 volts and the voltage at V1 has risen from 0 volts to about 2.2 volts. The particular voltages described here apply to the situation where $V_{DD}$=3 volts.

At the time $T_1$, transistors M3N and M3P are turned off and transistors M1P and M2N are turned on. These transistors turning on will continue to charge the load capacitance coupled thereto until the voltage at V1 rises to 3 volts and the voltage at V2 falls to 0 volts. These final voltages will be reached long before time $T_3$.

At time $T_3$, the reverse process begins for transferring charge from load capacitor $C_{L1}$ to load capacitor $C_{L2}$. This is achieved by turning off transistors M1P and M2N and by turning on transistors M3N and M3P. This will cause the charge to flow from load capacitor $C_{L1}$ to load capacitor $C_{L2}$ and through the inductor $L_C$. This state will exist from time $T_3$ to time $T_4$.

From FIG. 5 and the circuit details contained thereon, the advantages of the present invention can be realized. The capacitive load on the circuit of FIG. 3 is the same as for the circuit of FIG. 1. The voltages and transition times are the same as well. It is readily observed, however, the curve for $I_{DD}$ is dramatically different from that of FIG. 1. In fact the area under the curve $I_{DD}$ is $Q_{DD}$=10 pC which is about ⅓ of that for the circuit of FIG. 1. Consequently, the circuit of FIG. 3 will operate at a power consumption of about ⅓ that of the circuit in FIG. 1.

Figure 6:
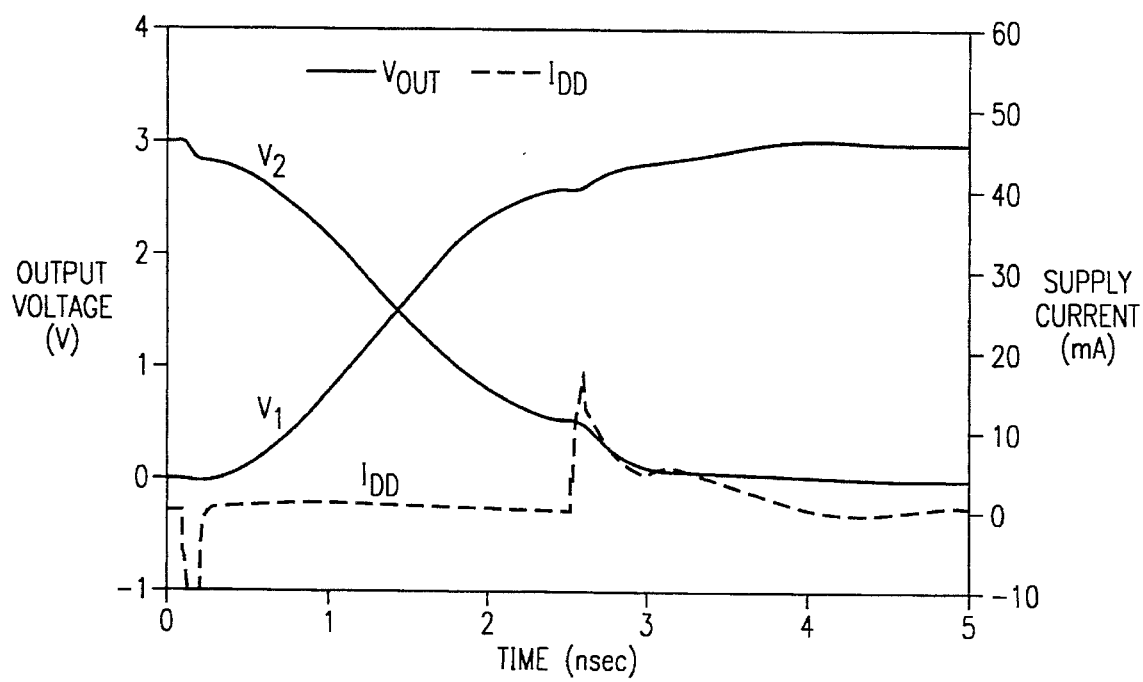
FIG. 6 is an illustration similar to FIG. 5 but for the specific components listed therein and arranged in the configuration of FIG. 3.

FIG. 6 illustrates the performance for the circuit of FIG. 3 where the inductor is larger than those discussed in connection with FIG. 5. As noted in FIG. 6, in this modified configuration, the charge required from the power supply to complete the charging of one of the load capacitors of FIG. 3 is 7 pC which is even lower than for the earlier discussed circuit components. This improvement in power saving comes at the expense of a slower switching time so the designer must be mindful of the tradeoffs which must be made in selecting the final components for use in the present invention.

Figure 7:
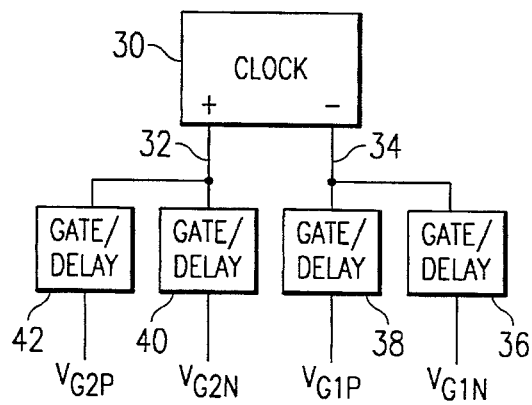
FIG. 7 is a schematic of a circuit for producing the needed clocking signals for the circuit of FIG. 3.

FIG. 7 illustrates a circuit for providing the gating signals for the transistors M1N, M1P, M2N and M2P. This circuit includes a clock circuit 30 for producing a square wave clock pulse output at a first clock output 32. The clock 30 also produces at a second clock output 34 a second square wave clock signal 180° out of phase with the first clock signal at 32. The first clock output 32 is coupled to a first and a second gate/delay circuit 36, 38. These circuits 36 and 38 are designed to either pass the clock signal coupled thereto or to delay the transition of the clock when it changes from one state to another. Specifically, the first gate/delay circuit 36 produces the signal $V_{G1N}$ and is designed to pass the clock transition of the clock signal at 34 when the transition is from a high level to a low level. The first gate/delay circuit 36, on the other hand, delays the transition of the clock signal at 34 when it transitions from a low to a high level. This is particularly illustrated for the signal $V_{G1N}$ in FIG. 4.

The second gate/delay circuit 38 couples to the clock signal at 34 and produces the signal $V_{G1P}$. This gate/delay circuit 38 operates to pass the clock signal input thereto delayed when the input clock signal transitions from high to low and transmits the clock signal input thereto undelayed when the clock signal transitions from low to high. This is illustrated for the signal $V_{G1P}$ in FIG. 4.

Figure 8:
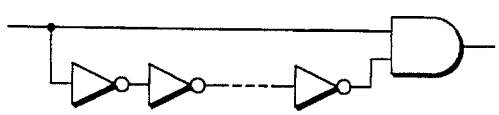
FIG. 8 illustrates a circuit for delaying a pulse at its rising edge and for passing the pulse at its falling edge.
Figure 9:
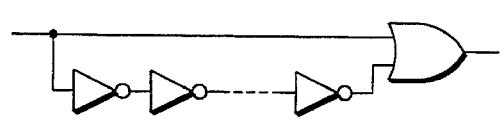
FIG. 9 illustrates a circuit for delaying a pulse at its falling edge and for passing the pulse at its rising edge.

The second clock signal at 32 is coupled to two gate/delay circuits 40 and 42. The output from the gate/delay circuit 40 is the signal $V_{G2N}$ and the output of gate/delay 42 is the signal $V_{G2P}$. These signals are illustrated in FIG. 4. Those of skill in the art will readily recognize from FIG. 4 that the gate/delay circuit 40 needs to act in the same manner as the gate/delay circuit 36. In a similar fashion, the gate delay circuit 42 must function in the same manner as does gate/ delay circuit 38. Accordingly, gate/delay circuit 36 and gate/delay circuit 40 are constructed in the same manner. A circuit for performing the function of gate/delay circuit 36 or 40 is illustrated in FIG. 8. A circuit for performing the function of the gate/delay circuit 38 or 42 is illustrated in FIG. 9. The circuits of FIG. 8 and FIG. 9 are designed so that the propagation delay of the inverters coupled in series is equal to ½ the LC period at its natural resonant frequency.

While the above description has been made with particular emphasis on the embodiment illustrated in the drawings, those of skill in the art will recognize that various modifications can be made without departing from the spirit and scope of the present invention. For example, the time period during which the pass gate transistors M3N and M3P are turned on can be selected to be a different time from that described above. Indeed, the time could be greater or lesser than that described. If the time is shorter, the total charge transferred would be smaller, however, the complete transition of the clock from one state to another may be faster. On the other hand, if the time is longer than described above, then more of the charge would be transferred, however, the speed of transition from one state to another would be reduced. Those of skill in the art can readily conceive further modifications to the invention.

What is claimed is:

1. A power conserving clock driver circuit comprising, a clock for producing a first clock signal and a second clock signal 180° out of phase with said first clock signal;

a first driver circuit coupled to said first clock signal for producing at a first output a first power clock signal for driving a first capacitive load coupled thereto;

a second driver circuit coupled to said second clock signal for producing at a second output a second power clock signal for driving a second capacitive load coupled thereto;

means responsive to the change in level of said first clock signal to make said first driver circuit non-operative during a period of time;

means responsive to the change in level of said second clock signal to make said second driver circuit non-operative during said period of time; and means to couple the capacitive load coupled to said first output to the capacitive load coupled to said second output, said means for coupling including an inductor and a switch operative during said period of time to transfer the charge on one said capacitive load through said inductor to the other said capacitive load.

2. The power conserving clock driver circuit of claim 1 wherein said time period is approximately the time for one half cycle of the natural resonant frequency of the circuit comprised of said inductor, said first capacitive load and said second capacitive load.

3. The power conserving clock driver circuit of claim 1 additionally including means to delay transmission of either said first and second clock pulse when the clock state transitions from a high to a low and to transmit undelayed said first and second clock pulse when the clock transitions from a low to a high.

4. The power conserving clock driver circuit of claim 1 additionally including means to delay transmission of either said first and second clock pulse when the clock state transitions from a low to a high and to transmit undelayed said first and second clock pulse when the clock transitions from a high to a low.

5. The power conserving clock driver circuit of claim 4 additionally including means to delay transmission of either said first and second clock pulse when the clock state transitions from a high to a low and to transmit undelayed said first and second clock pulse when the clock transitions from a low to a high.

6. A power conserving clock driver circuit comprising:

a first terminal for coupling to a first power source;

a second terminal for coupling to a second power source;

a first and second P-type transistor coupled to said first terminal;

a first and second N-type transistor coupled to said second terminal;

said first P-type transistor and said first N-type transistor being coupled together at a first output terminal;

said second P-type transistor and said second N-type transistor being coupled together at a second output terminal;

an inductor with two leads, one lead of which is coupled to one said output terminal; and a third P-type transistor and a third N-type transistor connected in a pass gate configuration between said other lead of said inductor and said other output terminal.

7. The power conserving clock driver circuit of claim 6 additionally including:

a differential clock for producing a first clock signal and a second clock signal 180° out of phase with said first clock signal;

a first gate/delay circuit coupled to said first clock signal for producing a first gating signal which follows said first clock signal when said first clock signal transitions from high to low and delays for a time period T the tracking of said first clock signal when said first clock signal transitions from low to high;

a second gate/delay circuit coupled to said first clock signal for producing a second gating signal which follows said first clock signal when said first clock signal transitions from low to high and delays for a time period T the tracking of said first clock signal when said first clock signal transitions from high to low;

a third gate/delay circuit coupled to said second clock signal for producing a third gating signal which follows said second clock signal when said second clock signal transitions from high to low and delays for a time period T the tracking of said-third clock signal when said second clock signal transitions from low to high;

a fourth gate/delay circuit coupled to said second clock signal for producing a fourth gating signal which follows said second clock signal when said second clock signal transitions from low to high and delays for a time period T the tracking of said second clock signal when said second clock signal transitions from high to low;

means to couple said first, second, third and fourth clock signals respectively to the gates of said first N-type, first P-type, second N-type and second P-type transistors;

a gate pulse producing circuit responsive to transitions of either said first or said second clock signal to produce a gate pulse of duration T; and means responsive to said gate pulse of duration T for turning on said third P-type and said third N-type transistors on.

8. The power conserving clock driver circuit of claim 7 wherein T is substantially one half cycle at the resonant frequency of the network formed by the capacitive load on each said output terminal and said inductor.

\* \* \* \* \*